United States Patent
Tzu

(10) Patent No.: US 9,520,343 B1
(45) Date of Patent: Dec. 13, 2016

(54) FIELD-EFFECT TRANSISTOR STRUCTURE FOR PREVENTING FROM SHORTING

(71) Applicant: Chung Hsing Tzu, Taipei (TW)

(72) Inventor: Chung Hsing Tzu, Taipei (TW)

(73) Assignee: Great Team Backend Foundry Inc. (VG)

( * ) Notice: Subject to any disclaimer, the term of this patent is extended or adjusted under 35 U.S.C. 154(b) by 0 days.

(21) Appl. No.: 14/729,588

(22) Filed: Jun. 3, 2015

(51) Int. Cl.
*H01L 23/62* (2006.01)
*H01L 23/495* (2006.01)

(52) U.S. Cl.
CPC ......... *H01L 23/49541* (2013.01); *H01L 23/62* (2013.01)

(58) Field of Classification Search
CPC .................. H01L 23/62; H01L 23/49541

USPC ........................................... 257/676
See application file for complete search history.

(56) References Cited

U.S. PATENT DOCUMENTS

2012/0248539 A1* 10/2012 Zhang ............... H01L 23/49503
257/368
2015/0206868 A1* 7/2015 Zhang .................. H01L 24/40
438/108

\* cited by examiner

*Primary Examiner* — Tran Tran

(57) ABSTRACT

A field-effect transistor (FET) structure for preventing from shorting is disclosed. The field-effect transistor (FET) structure is applying to a power discrete device, such as the MOSFET or IGBT. The field-effect transistor structure comprises a MOSFET chip and a metal clip. A silver layer (or silver string) is welded on the surface of the metal clip jointed with the source pad so that the silver paste may be not overflowed and permeated into the gate bus to achieve the effect of preventing from shorting.

6 Claims, 5 Drawing Sheets

140
FIELD-EFFECT TRANSISTOR STRUCTURE FOR PREVENTING FROM SHORTING

FIELD OF THE INVENTION

The present invention relates to a field-effect transistor (FET) structure, and more particularly to a field-effect transistor (FET) structure for preventing from shorting applying to the MOSFET or IGBT. A silver layer (or silver string) is welded on the surface of the metal clip jointed with the source pad so that the silver paste may be not overflowed and permeated into the gate bus to achieve the effect of preventing from shorting.

BACKGROUND OF THE INVENTION

The conventional field-effect transistor (FET) has the gate pad and the source pad fabricated thereon. The gate pad is electrically connected with the source pad by metal leads. And the source pad is electrically connected with the pins of the transistor by a plurality of metal leads. However, the structure has complicated processes and is easy to waste time while processing. In packaging, the metal leads may be broken or peeled easily to result in bad electrical connection. And further the failure rate will increase because heat dissipation is not easy after packaging.

Please refer to FIGS. 1 and 2, in order to solve the problems, a structure is developed. That is, one end of a sheet metal clip 5 is covered on the source pad 1 and the other end of the sheet metal clip 5 is electrically connected with the pins to replace the connection of the metal leads. The structure has the effects of stable electrical connection, easy to be packaged, low resistance, and better heat dissipation. However, a gate bus 2 may be cut at the source pad 1 for electrically connecting with the gate pad. The surface of the source 1 must be coated a silver paste 4 first and then the metal clip 5 is covered on the source pad 1 and pressed to fix before the metal dip 5 is fixed on the source pad 1 to electrically connect with each other. But the silver paste 4 may be overflowed and permeated in to the gate bus 2 due to pressing. As a result, the gate pad 3 is electrically connected with the source 1 all the time to result in shorting.

Accordingly, the inventor of the present invention has devoted himself based on his many years of practical experiences to solve this problem.

SUMMARY OF THE INVENTION

The primary object of the present invention is to provide a field-effect transistor (FET) structure for preventing form shorting and applying to the MOSFET or IGBT. A silver layer (or silver string) is welded on the surface of the metal clip jointed with the source pad so that the silver paste may be not overflowed and permeated into the gate bus to achieve the effect of preventing from shorting.

Further features and advantages of the present invention will become apparent to those of skill in the art in view of the detailed description of preferred embodiments which follows, when considered together with the attached drawings and claims.

BRIEF DESCRIPTION OF THE DRAWINGS

All the objects, advantages, and novel features of the invention will become more apparent from the following detailed descriptions when taken in conjunction with the accompanying drawings.

FIG. 1 is a top plane view of a conventional field-effect transistor which a silver paste is welded on.

DESCRIPTION OF THE PREFERRED EMBODIMENT

Figure 1:
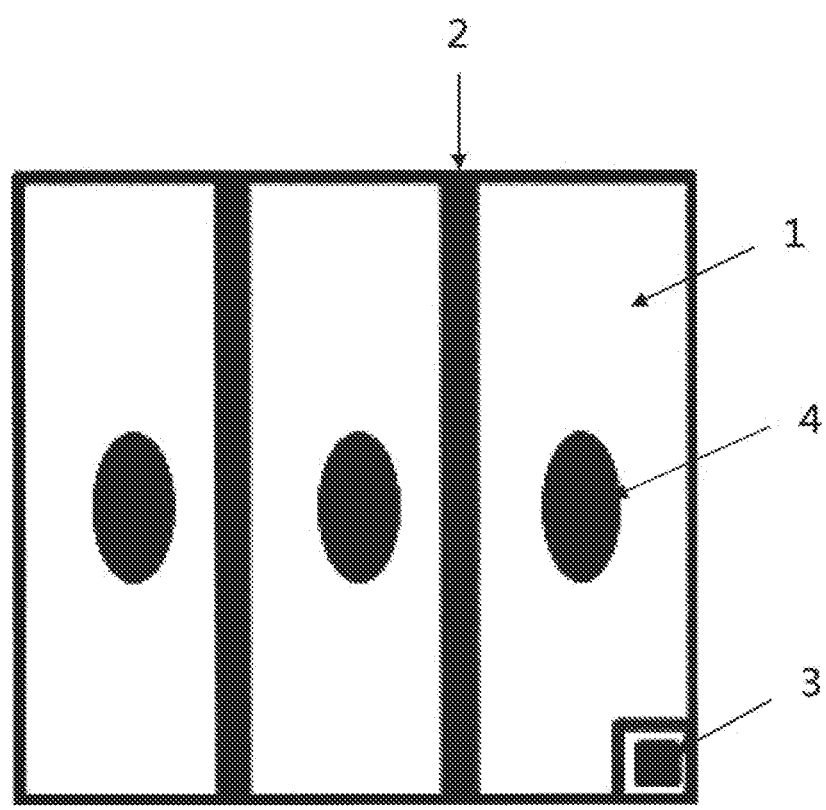
Figure 2:
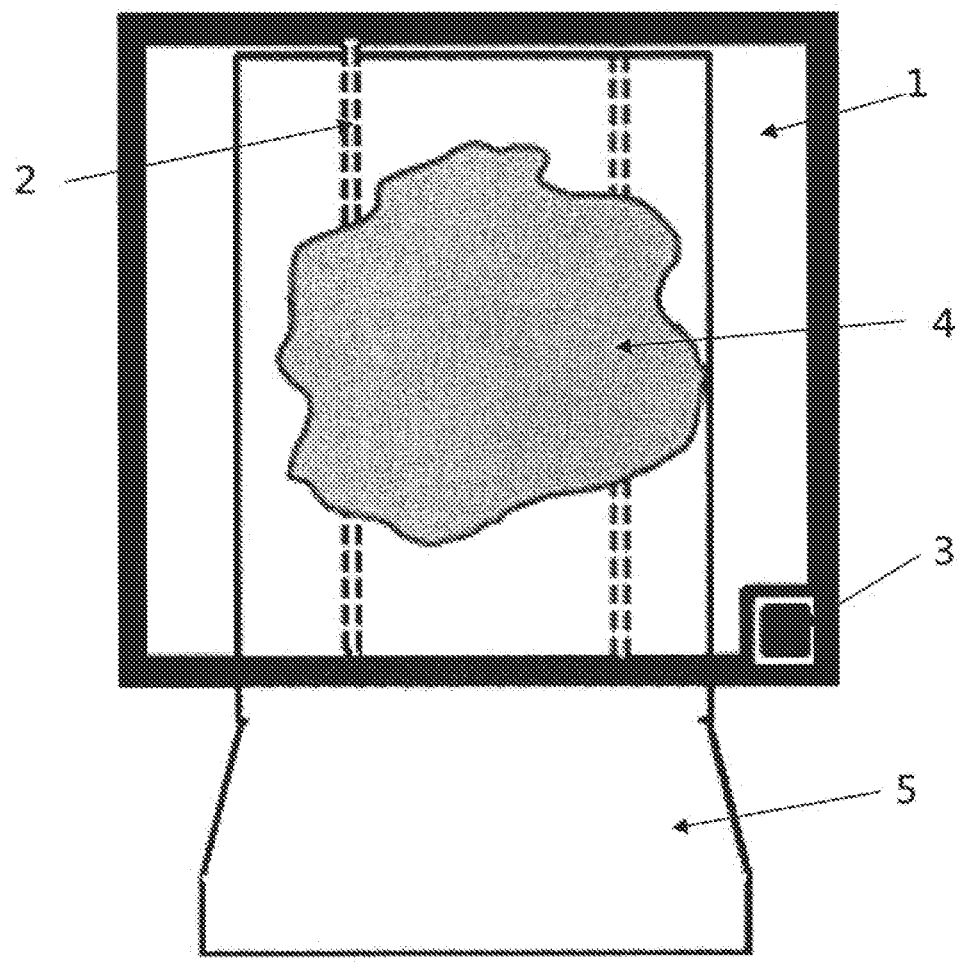
FIG. 2 is a top plane view of another conventional field-effect transistor while the silver paste is overflowed after covering the metal clip.

Referring now to the drawings where like characteristics and features among the various figures are denoted by like reference characters.

Figure 4:
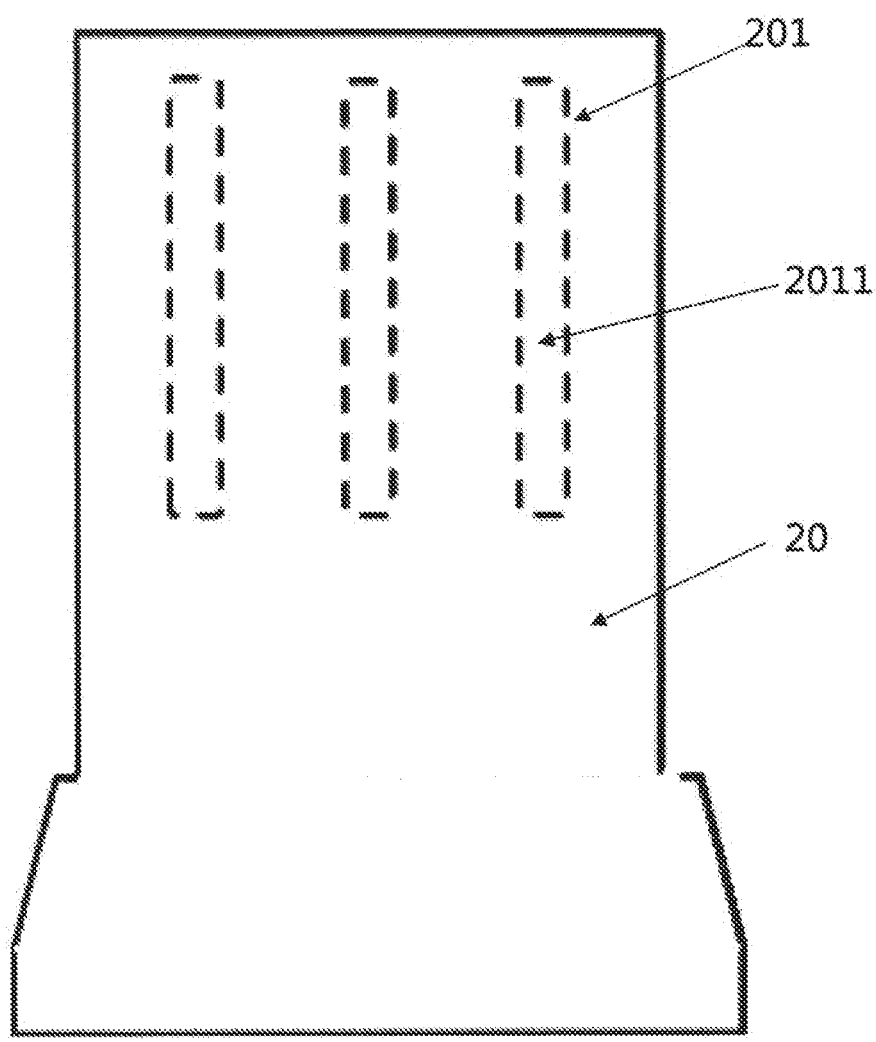
FIG. 4 is a top plane view of another embodiment of the metal clip of a field-effect transistor structure for preventing from shorting according to present invention.
Figure 5:
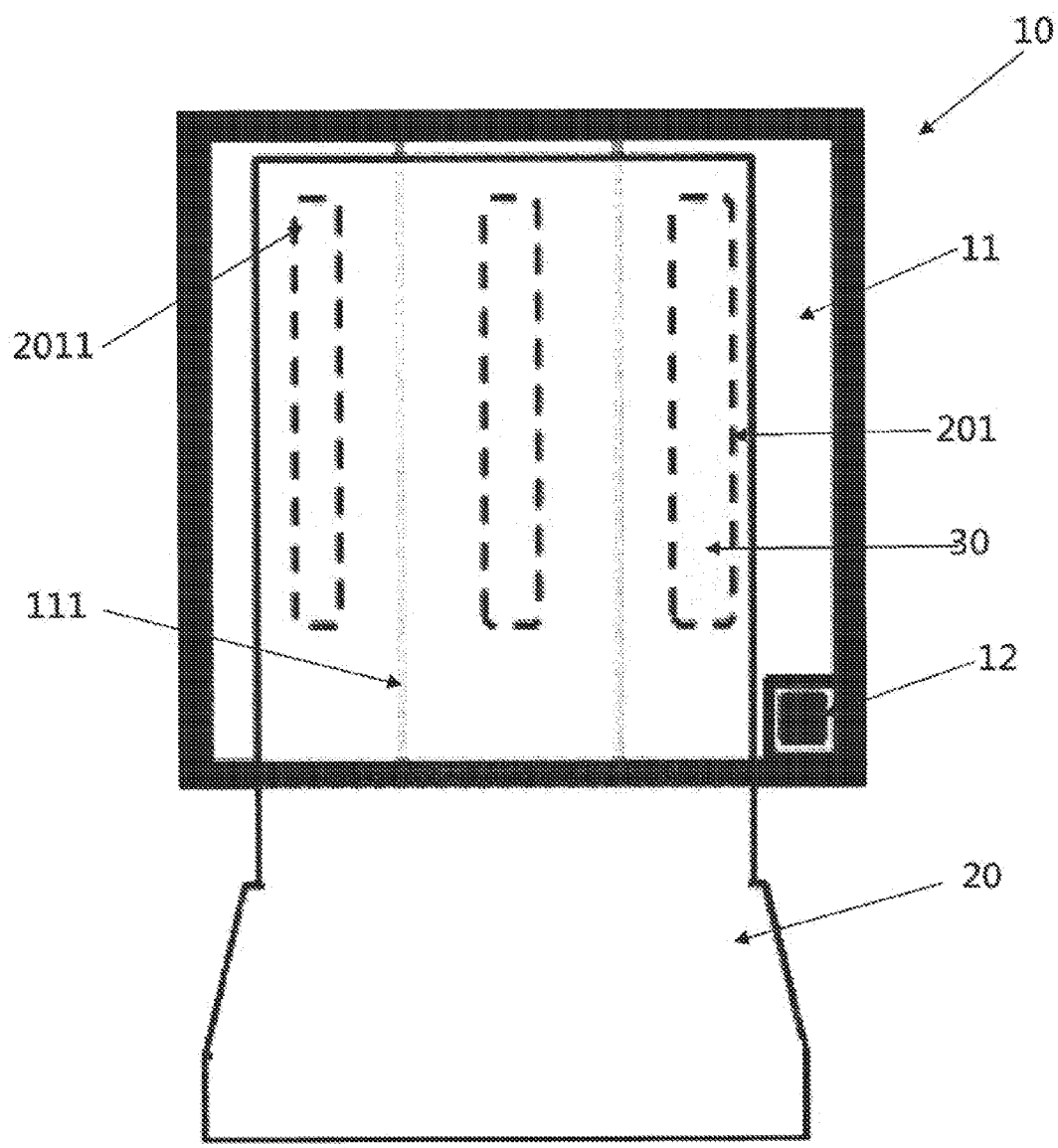
FIG. 5 is a perspective view of the field-effect transistor structure according to present invention after covering the metal clip.

Please refer to FIGS. 4 and 5, the field-effect transistor structure for preventing from shorting of the present invention mainly comprises a MOSFET chip 10 and a metal clip 20. A source pad 11 and a gate pad 12 may be fabricated on the MOSFET chip 10. And a gate bus 111 may be cut on the source pad 11 so as to electrically connect with the gate pad 12.

One end of the metal dip 20 may be electrically connected with the source pad 11 of the MOSFET chip 10 and the other end of the metal clip 20 may be electrically connected with a pin (not shown). A plurality of grooves 201 may be concavely arranged on the metal clip 20 and corresponding to a surface of the metal clip 20 faced to the conjunction of the metal clip 20 and source pad 10. Each groove 201 is dodged the gate bus 111 fabricated on the source pad 11 of the MOSFET chip 10. That is, the shape and size of each groove 201 are not limited thereto, but each groove 201 may not cross the gate bus 111. And a silver layer 2011 may be fabricated in each groove 201.

When the metal clip 20 and the source pad 11 of the MOSFET chip 10 are jointed together, a silver paste 30 may be welded on the source pad 11 to dodge the gate bus 111 first and then the silver paste 30 may be led by the silver layer 2011 since location of each groove 201 of the metal clip 20 is arranged corresponding to the welding location of the silver paste 30, the metal wetting is produced between the silver paste 30 and the silver layer 2011, and the grooves 201 are concavely arranged at the metal dip 20 and the silver layer 2011 is coated thereon. Therefore, the silver paste 2011 is led in the grooves 201 by the silver layer 30. The silver paste 30 may not be overflowed and even permeated into the gate bus 111 while the metal dip 20 is bonded on the source pad 11 of the MOSFET chip 10. It may prevent the gate pad 12 and the source pad 11 from being electrically connected with each other all the times and prevent the MOSFET chip 10 from shorting.

Figure 3:
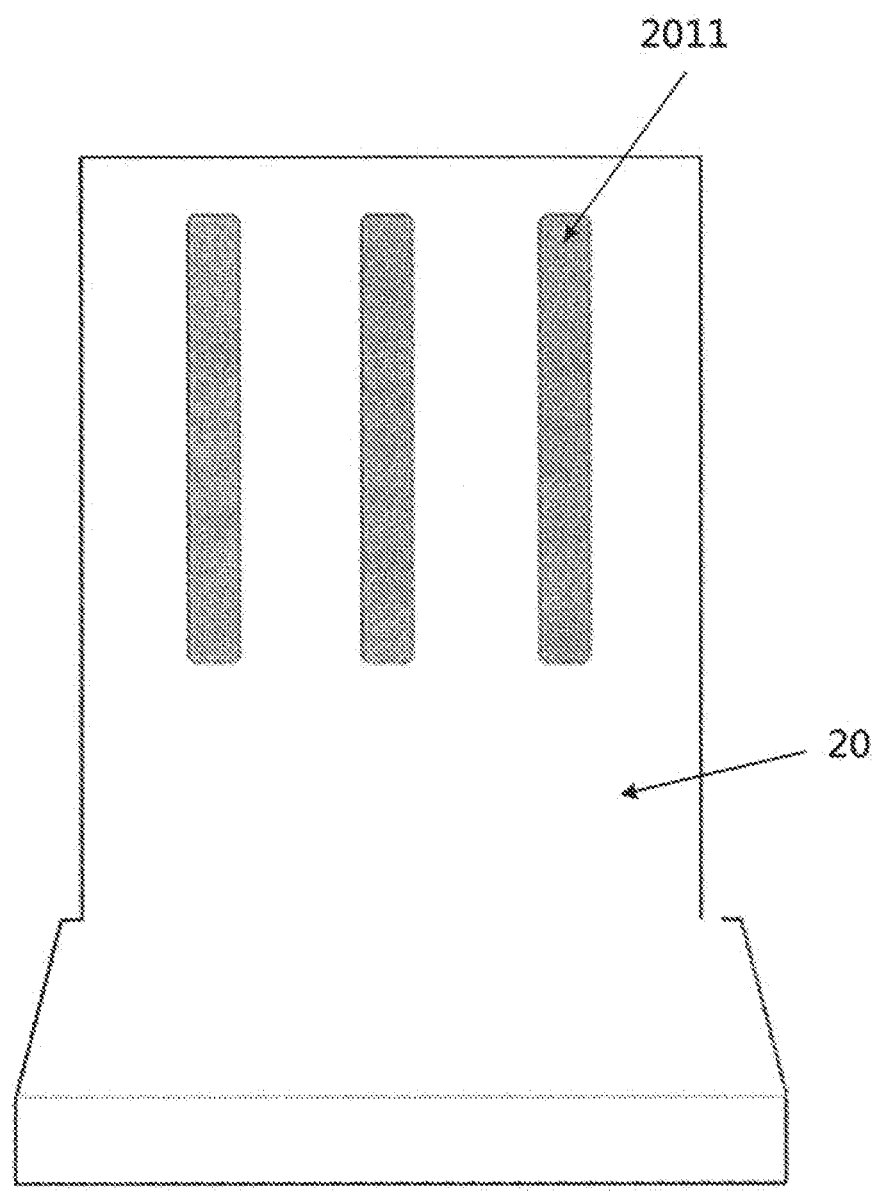
FIG. 3 is a top plane view of one embodiment of a metal clip of a field-effect transistor structure for preventing from shorting according to present invention.

Please refer to FIG. 3, this embodiment of the field-effect transistor structure has not the grooves 201 concavely arranged on the metal dip 20, but a silver layer 2011 is welded at an area arranged on the metal dip 20 corresponding to an area of the source pad 11 reserved for welding the silver paste 30. It may also prevent the gate pad 12 and the source pad 11 from being electrically connected with each other all the times and prevent the MOSFET chip 10 from shorting.

In summary, compared to the conventional field-effect transistor (FET) structure, the field-effect transistor structure for preventing from shorting of present invention may prevent from shorting and extend the service life of the transistor. At the same time, the arrangement of the metal clip 20 may not only make the electrical connection better, but also improve the heat dissipation of the transistor.

The foregoing descriptions are merely the exemplified embodiments of the present invention, where the scope of the claim of the present invention is not intended to be limited by the embodiments. Any equivalent embodiments or modifications without departing from the spirit and scope of the present invention are therefore intended to be embraced.

The disclosed structure of the invention has not appeared in the prior art and features efficacy better than the prior structure which is construed to be a novel and creative invention, thereby filing the present application herein subject to the patent law.

What is claimed is:

1. A field-effect transistor structure for preventing from shorting, comprising:
    a MOSFET chip, a source pad and a gate pad are fabricated thereon, and a gate bus is cut on the source pad so as to electrically connect with the gate pad;
    a metal clip, one end thereof is electrically connected with the source pad of the MOSFET chip and the other end thereof is electrically connected with a pin;
    a plurality of grooves, concavely arranged on the metal clip and corresponding to a surface of the metal clip faced to the conjunction of the metal clip and source pad, and a silver layer is fabricated in each groove; and
    a silver paste, welded in a predetermined area of the source pad of the MOSFET chip which is desired to bond with the metal clip.

2. The structure as claimed in claim 1, wherein each groove is dodged the gate bus fabricated on the source pad.

3. The structure as claimed in claim 1, wherein the silver layer is coated or welded on each groove.

4. A field-effect transistor structure for preventing from shorting, comprising:
    a MOSFET chip, a source pad and a gate pad are fabricated thereon, and a gate bus is cut on the source pad so as to electrically connect with the gate pad;
    a metal clip, one end thereof is electrically connected with the source pad of the MOSFET chip and the other end thereof is electrically connected with a pin;
    a plurality of silver metals, fabricated on the metal clip and corresponding to a surface of the metal clip faced to the conjunction of the metal clip and source pad, and a silver layer is fabricated in each groove; and
    a silver paste, welded in a predetermined area of the source pad of the MOSFET chip which is desired to bond with the metal clip.

5. The structure as claimed in claim 4, wherein each silver metal is dodged the gate.

6. The structure as claimed in claim 4, wherein the silver layer is coated or welded on each silver metal.

* * * * *